United States Patent
Vaupel et al.

(10) Patent No.: US 9,147,639 B2
(45) Date of Patent: Sep. 29, 2015

(54) SEMICONDUCTOR DIES HAVING OPPOSING SIDES WITH DIFFERENT REFLECTIVITY

(71) Applicant: Infineon Technologies AG, Neubiberg (DE)

(72) Inventors: Mathias Vaupel, Regensburg (DE); Günther Ruhl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 77 days.

(21) Appl. No.: 14/015,353

(22) Filed: Aug. 30, 2013

(65) Prior Publication Data

US 2015/0061113 A1 Mar. 5, 2015

(51) Int. Cl.
| | |
|---|---|
| H01L 21/66 | (2006.01) |
| H01L 23/48 | (2006.01) |
| H01L 21/56 | (2006.01) |
| H01L 21/673 | (2006.01) |
| H01L 23/29 | (2006.01) |
| H01L 23/31 | (2006.01) |

(52) U.S. Cl.
CPC .............. *H01L 23/48* (2013.01); *H01L 21/56* (2013.01); *H01L 21/673* (2013.01); *H01L 22/12* (2013.01); *H01L 23/291* (2013.01); *H01L 23/3171* (2013.01)

(58) Field of Classification Search
USPC .......................................... 257/734; 438/118
See application file for complete search history.

(56) References Cited

U.S. PATENT DOCUMENTS

2011/0017407 A1* 1/2011 Hsu et al. ...................... 156/584

\* cited by examiner

*Primary Examiner* — Wael Fahmy
*Assistant Examiner* — Sarah Salerno
(74) *Attorney, Agent, or Firm* — Murphy, Bilak & Homiller, PLLC

(57) ABSTRACT

A method of processing semiconductor dies is provided. Each semiconductor die has a first side with one or more terminals, a second side opposite the first side and sidewalls extending between the first and the second sides. The semiconductor dies are processed by placing the semiconductor dies on a support substrate so that the first side of each semiconductor die faces the support substrate and the second side faces away from the support substrate. A coating is applied to the semiconductor dies placed on the support substrate. The coating has a lower reflectivity than the first side of the semiconductor dies. The coating covers the second side and at least a region of the sidewalls nearest the second side of each semiconductor die. The semiconductor dies are removed from the support substrate after applying the coating for further processing as loose dies such as taping.

9 Claims, 3 Drawing Sheets

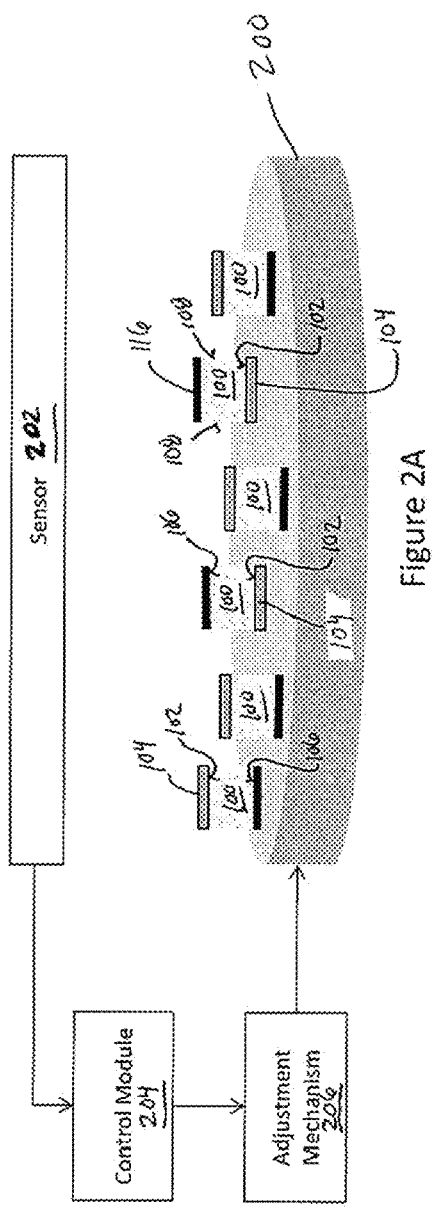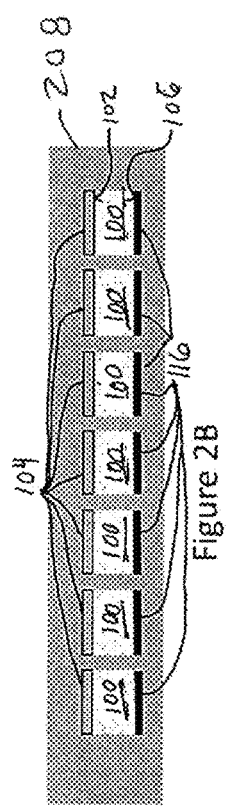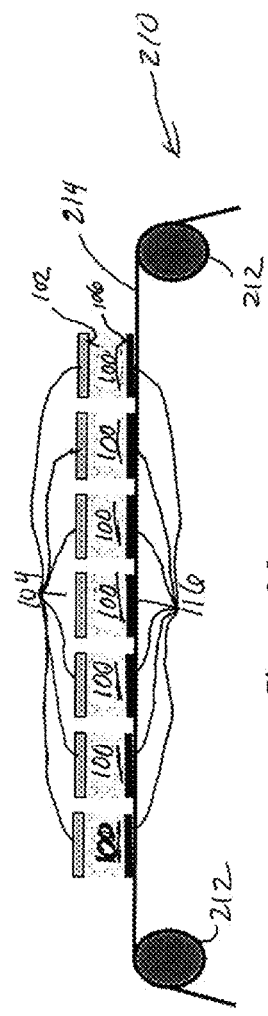

SEMICONDUCTOR DIES HAVING OPPOSING SIDES WITH DIFFERENT REFLECTIVITY

TECHNICAL FIELD

The present application relates to non-molded semiconductor dies (chips), in particular taping of non-molded semiconductor dies.

BACKGROUND

Some tape and reel systems for non-molded semiconductor dies include a feeder or bowl for receiving loose dies, a linear feeder for arranging the dies in a line and a taping apparatus for adhering the dies to an adhesive film. Prior to taping, the loose dies must be aligned in a feeder such that the top side of each die faces the same direction and the bottom side of each die faces the opposite direction to ensure reliable post-taping processing of the dies such as testing, pick-and-place, etc. To this end, conventional tape and reel systems for loose non-molded dies typically include cameras for visually inspecting the orientation of the individual dies placed in a feeder of the taping system. The feeder can be vibrated to change the orientation of the loose dies or a gentle stream of air can be forced across the dies. The dies can be re-loaded in the feeder in a further attempt to properly orientate the dies. After all of the loose dies are properly orientated in the feeder, and the aligned dies are put in a carrier tape. The camera systems used in conventional tape and reel systems for loose non-molded dies limit the number of dies that can be processed, reducing production throughput.

SUMMARY

According to an embodiment of a method of processing semiconductor dies each having a first side with one or more terminals, a second side opposite the first side and sidewalls extending between the first and the second sides, the method comprises: placing the semiconductor dies on a support substrate so that the first side of each semiconductor die faces the support substrate and the second side faces away from the support substrate; applying a coating to the semiconductor dies placed on the support substrate, the coating having a lower reflectivity than the first side of the semiconductor dies and covering the second side and at least a region of the sidewalls nearest the second side of each semiconductor die; and removing the semiconductor dies from the support substrate after applying the coating.

According to an embodiment of a method of fixing semiconductor dies to an adhesive film, each semiconductor die having a first side with one or more terminals, a second side opposite the first side and sidewalls extending between the first and the second sides, the method comprises: treating the second side of the semiconductor dies so that the treated second side of each semiconductor die has a lower reflectivity than the first side; placing the semiconductor dies into a feeder after being treated at the second side, with one of the first or second side of each semiconductor die facing the feeder and the other side facing away from the feeder; measuring the reflectivity of the side of the semiconductor dies facing away from the feeder; determining, based on the measured reflectivity, whether any of the semiconductor dies placed in the feeder should be flipped so that the opposite side faces the feeder and the first side of each semiconductor die faces the same direction; and placing the semiconductor dies on a carrier tape after the first side of each semiconductor die faces the same direction in the feeder.

According to an embodiment of a semiconductor die, the semiconductor die comprises a semiconductor body having a first side, a second side opposite the first side and sidewalls extending between the first and the second sides, and one or more terminals at the first side of the semiconductor body. The semiconductor die further comprises an electrically insulating coating covering the second side of the semiconductor body and at least a region of the sidewalls of the semiconductor body nearest the second side. The coating has a lower electrical conductivity than the semiconductor body.

According to an embodiment of a semiconductor die taping apparatus, the apparatus comprises a feeder, a sensor, a control module, an adjustment mechanism and a taping mechanism. The feeder is for receiving a plurality of loose semiconductor dies, each semiconductor die having a first side with one or more terminals and a second side opposite the first side, the second side of each semiconductor die having a lower reflectivity than the first side. The sensor is operable to measure the reflectivity of the side of the loose semiconductor dies facing the sensor. The control module is operable to determine, based on the measured reflectivity, whether any of the loose semiconductor dies placed in the feeder should be flipped so that the opposite side faces the feeder and the first side of each loose semiconductor die faces the same direction. The adjustment mechanism is operable to actuate the loose semiconductor dies placed in the feeder responsive to input received from the control module. The taping mechanism is operable to place the devices on a carrier tape after the first side of each semiconductor die faces the same direction in the feeder.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes FIGS. 2A through 2C, illustrates different components of a tape and reel system and corresponding stages of a method of placing semiconductor dies on a carrier tape using the tape and reel system.

DETAILED DESCRIPTION

The embodiments described herein provide a method of processing non-molded semiconductor dies so that opposing main sides of each die have different reflectivity. An apparatus and corresponding method are also provided for placing loose semiconductor dies having opposing sides with different reflectivity on a carrier tape. Due to the reflectivity difference at the two main sides of the semiconductor dies, a sensor can be used to determine whether all of the semiconductor dies are orientated properly within the taping apparatus instead of using cameras. The sensor, which can include a single sensor device or an array of sensor devices, measures the reflectivity of the side of the dies facing the sensor. If one or more of the dies is orientated improperly, this condition can be detected based on the measured reflectivity data. For example in the case of silicon dies, the main side of the dies without terminals can be treated e.g. by applying a coating or forming black silicon at this side. The treated side has a lower reflectivity than the silicon and metal terminals at the opposing side. The sensor can detect improperly orientated dies, based on the amount of light (e.g. UV, VIS or IR) reflected back to the sensor. If the treated side of one or more of the dies faces the sensor, less light is detected by the sensor than if the opposing side faced the sensor. If one or more dies are determined to be improperly orientated, one or more attempts can be made to flip these dies so that the same side of each die faces the same direction prior to taping. The sensor has a much faster reaction time as compared to cameras used in conventional tape and reel systems, significantly increasing throughput e.g. by about 100% or more.

Figure 1A:
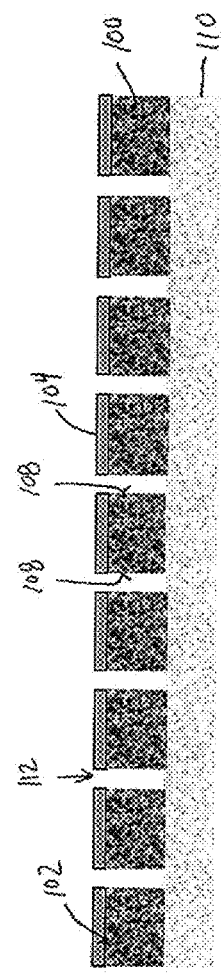
FIGS. 1A through 1O, illustrates different stages of a method of processing non-molded semiconductor dies so that opposing main sides of the dies have different reflectivity.
Figure 1B:
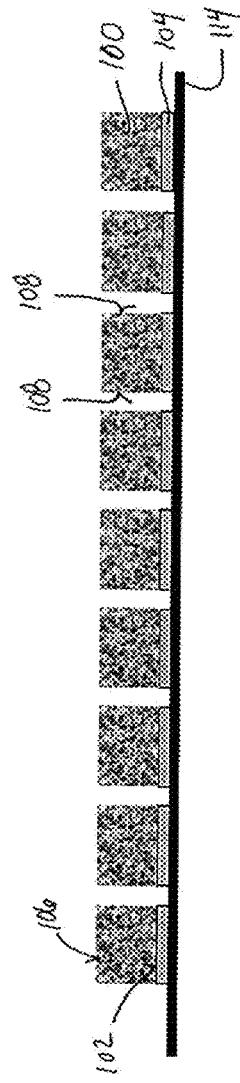
FIG. 1, which includes
Figure 1C:
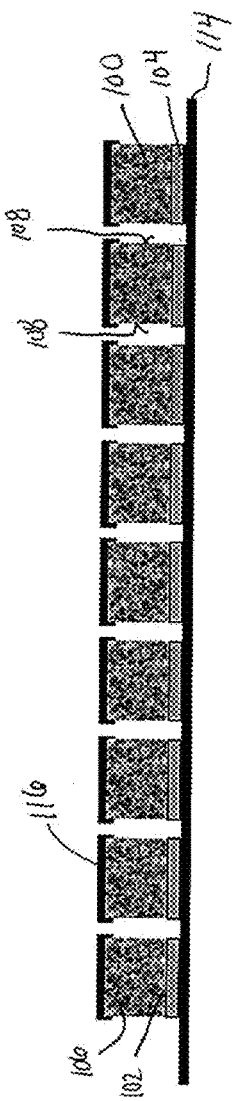

FIG. 1, which includes FIGS. 1A through 10, illustrates an embodiment of a method of processing non-molded semiconductor dies 100 each having a first side 102 with one or more terminals 104, a second side 106 opposite the first side 102 and sidewalls 108 extending between the first and the second sides 102, 106. FIG. 1A shows a cross-sectional view of a semiconductor substrate 110 of which the semiconductor dies 100 are fabricated. The dies 100 have been partly separated from one another by dicing or etching along separation channels 112, but remain attached to the semiconductor substrate 110 in FIG. 1A. FIG. 1B shows the semiconductor dies 100 after a support substrate 114 such as a foil or film is attached to the first side 102 of the dies 100 with the terminal(s) 104 and the remaining semiconductor substrate 110 is removed by thinning e.g. by chemical etching and/or grinding to expose the second side 106 of the dies 100. The foil/film 114 can be an adhesive film that holds and protects the semiconductor structure during subsequent process steps. FIG. 10 shows the semiconductor dies 100 after the second side 106 of the dies 100 is treated so that the treated second side 106 of each semiconductor die 100 has a lower reflectivity than the first side 102. Treating the semiconductor dies 100 in this way allows for subsequent use of a sensor instead of a camera to detect the orientation of the dies 100 in a taping apparatus based on the measured reflectivity of the dies 100, in order to ensure all dies 100 are orientated properly prior to taping.

The second side 106 of the dies 100 is treated at relatively low temperatures to protect the dicing foil/film 114 from destructive temperatures. For example the semiconductor dies 100 can be treated at temperatures below about 200° C. for standard dicing foils/films 114 to lower the reflectivity at the second side 106 of the dies 100. If the dicing foil/film 114 is less sensitive to temperature, the second side 106 of the dies 100 can be treated at higher temperatures.

In one embodiment, the semiconductor dies 100 are treated by applying a coating 116 to the second side 106 of each semiconductor die 100. The coating 116 has a lower reflectivity than the first side 102 of the dies 100. For example in the case of silicon dies 100, the first side 102 of each die 100 has a certain reflectivity owing to the semiconductor material of the dies 100 and metal terminal(s) 104 disposed at the first side 102 of the dies 100. The reflectivity of the coating 116 applied to the second side 104 of the dies 100 is lower than the reflectivity of the silicon material and the metal terminal(s) 104.

The coating 116 can cover the second side 106 and at least a region of the sidewalls 108 nearest the second side 106 of each semiconductor die 100 as shown in FIG. 10. In one embodiment, the coating 116 is applied by plasma deposition and is thicker on the second side 106 of the semiconductor dies 100 than on the sidewalls 108. The ratio of the sidewall thickness to the backside (second side) thickness of the coating 116 can be adjusted as desired by modifying the deposition parameters such as process pressure. In another embodiment, the coating 116 is applied by ALD (atomic layer deposition) and has uniform thickness. In yet another embodiment, the coating 116 is applied by spray coating. In each case, the coating 116 preferably causes no electrical interference with the dies 100, has good adhesion and high hardness (i.e. little or no removal by friction during subsequent processing), low reflectivity at a particular wavelength so that the difference in reflectivity between the first and second sides 102, 106 of the dies 100 can be detected by a sensor tuned to that wavelength, and low conductivity (i.e. sufficient electrical insulation behaviour).

The reflectivity of the second side 106 of the semiconductor dies 100 can be adjusted by changing the refractive index and/or thickness of the coating 116. For example, depending on the type of material employed, the refractive index of the coating 116 can range from 1.3 to 2.0 and the thickness of the coating 116 can range from 50 nm to 2000 nm. Other ranges of refractive indexes and/or thicknesses are possible for the coating 116, which again depends on the type of coating material employed and sensor used to detect reflectivity. In one embodiment, the coating 116 comprises at least one of amorphous carbon (aC:H), $Al_2O_3$, $HfO_2$, $ZrO_2$, silicon oxide, silicon nitride, and polyimide. Amorphous carbon, $Si_3N_4$ and $SiO_2$ can be deposited on the second side 106 of the dies 100 by plasma-enhanced chemical vapor deposition (PECVD). $Al_2O_3$, $HfO_2$, $ZrO_2$ can be deposited on the second side 106 of the dies 100 by atomic layer deposition (ALD). Polyimide and other similar polymers can be deposited on the second side 106 of the dies 100 by spraying, spin-on or dip coating. Standard processes can be employed to deposit any of these materials, and therefore no further explanation is given in this regard. In the case of amorphous carbon and other suitably hard and low-reflective materials applied to the second side 106 of the semiconductor dies 100, the coating 116 is scratch resistant which is beneficial later on when the dies 100 are placed in a feeder of a taping system and jostled about in an attempt to orientate all dies in the proper direction.

In another embodiment, the semiconductor dies 100 comprise silicon and the second side 106 of the dies 100 is treated by forming so-called black silicon at the second side 106 of each die 100. Black silicon is formed by reactive ion etching (RIE), and results in a needle-shaped surface structure comprising single-crystal silicon needles. Black silicon is a surface modification of silicon with very low reflectivity and correspondingly high absorption of visible (and infrared) light. The single-crystal silicon needles typically have a height above 10 μm and diameter less than 1 μm. One main feature of black silicon is an increased absorption of incident light. The high reflectivity of silicon, which is usually 20-30% for quasi-normal incidence, is reduced to about 5% with black silicon. This is due to the formation of a so-called effective medium by the needles. Within this medium, there is no sharp interface, but a continuous change of the refractive index that reduces Fresnel reflection. When the depth of the graded layer is roughly equal to the wavelength of light in silicon (about one-quarter the wavelength in vacuum), the reflection is reduced to 5%. Deeper grades produce even blacker silicon. For low reflectivity, the nano-scale features producing the index graded layer must be smaller than the wavelength of the incident light to avoid scattering. In some cases, the second side 106 of the dies 100 can be treated by roughening to reduce the reflectivity e.g. by etching the second side 106.

Regardless of whether the second side 106 of the semiconductor dies 100 has black silicon, a coating or is roughened to reduce the reflectivity, an appropriately designed sensor can detect the difference in reflectivity between the first and second sides 102, 106 of the dies 100. This is particularly useful during subsequent taping of the dies 100, to ensure all dies 100 are orientated in the proper direction.

FIG. 2, which includes FIGS. 2A through 2C, illustrates an embodiment of a die taping apparatus and corresponding method of die taping. The loose semiconductor dies 100 are placed in a feeder 200 of the taping apparatus as shown in FIG. 2A. The first side 102 of the loose dies 100 should face the same direction and the second side 106 should face the opposite direction to ensure proper subsequent processing of the dies 100. However, some of the loose dies 100 may be improperly orientated in the feeder 200. As such, not all of the loose dies 100 may face the proper direction after placement in the feeder 200. For example, four loose dies 100 in FIG. 2A face the correct direction i.e. the first side 102 of the dies 100 with the terminal(s) 104 face away from the feeder 200. Two loose dies 100 in FIG. 2A face the wrong direction i.e. the second (treated) side 106 of the dies 100 face away from the feeder 200. The improperly orientated dies 100 must be corrected before taping.

To this end, the die taping apparatus further includes a sensor 202 for measuring the reflectivity of the side 102/106 of the loose semiconductor dies 100 facing the sensor 202. The sensor 202 is designed to measure light at a particular wavelength. The second side 106 of the loose dies 100 is treated to reflect little or no light at that wavelength. The first side 102 of the loose dies 100 reflects light at the wavelength of the sensor 202. This way, if one or more of the loose dies 100 faces the wrong direction, the sensor 202 will detect light reflected by the first side 102 of each die 100 incorrectly orientated in the feeder 200 of the taping apparatus. If all loose dies 100 are orientated properly in the feeder 200, the second side 106 of each die 100 faces the sensor 202 and little or no reflected light is detected by the sensor 202, indicating all dies 100 are properly positioned. Any standard sensor tuned to a particular wavelength sufficiently absorbed by the treated side 106 of the loose semiconductor dies 100 can be used.

The taping apparatus also includes a control module 204 for controlling operation of the taping apparatus. This includes determining, based on the reflectivity measured by the sensor 202, whether any of the loose semiconductor dies 100 placed in the feeder 200 of the taping apparatus should be flipped so that the opposite side faces the feeder 200 and the first side 102 of each die 100 faces the same direction. If positional correction is required of one or more of the loose dies 100, the control module 204 sends a command to an adjustment mechanism 206 of the taping system. The adjustment mechanism 206 actuates the loose semiconductor dies 100 placed in the feeder 200, responsive to input received from the control module 204. This can include vibrating the feeder 200 and/or directing a light puff of air toward the loose dies 100 in an attempt to flip those dies 100 which are improperly orientated. The control module 204 can include any standard controller, custom logic, memory, input/output circuitry, firmware, etc. for controlling operation of the taping apparatus. Given such standard components, one of ordinary skill in the art could readily implement the control module functions described herein and therefore no further explanation is given in this regard.

The taping apparatus also includes a linear feeder 208 for arranging the loose semiconductor dies 100 in a line after all dies 100 are properly orientated in the feeder 200, as shown in FIG. 2B. The taping apparatus also includes a taping mechanism 210 as shown in FIG. 2C. The taping mechanism 210 can include rollers 212 and/or other components for fixing the loose semiconductor dies 100 to an adhesive film 214 after the first side 102 of each die 100 faces the same direction.

Figure 3:
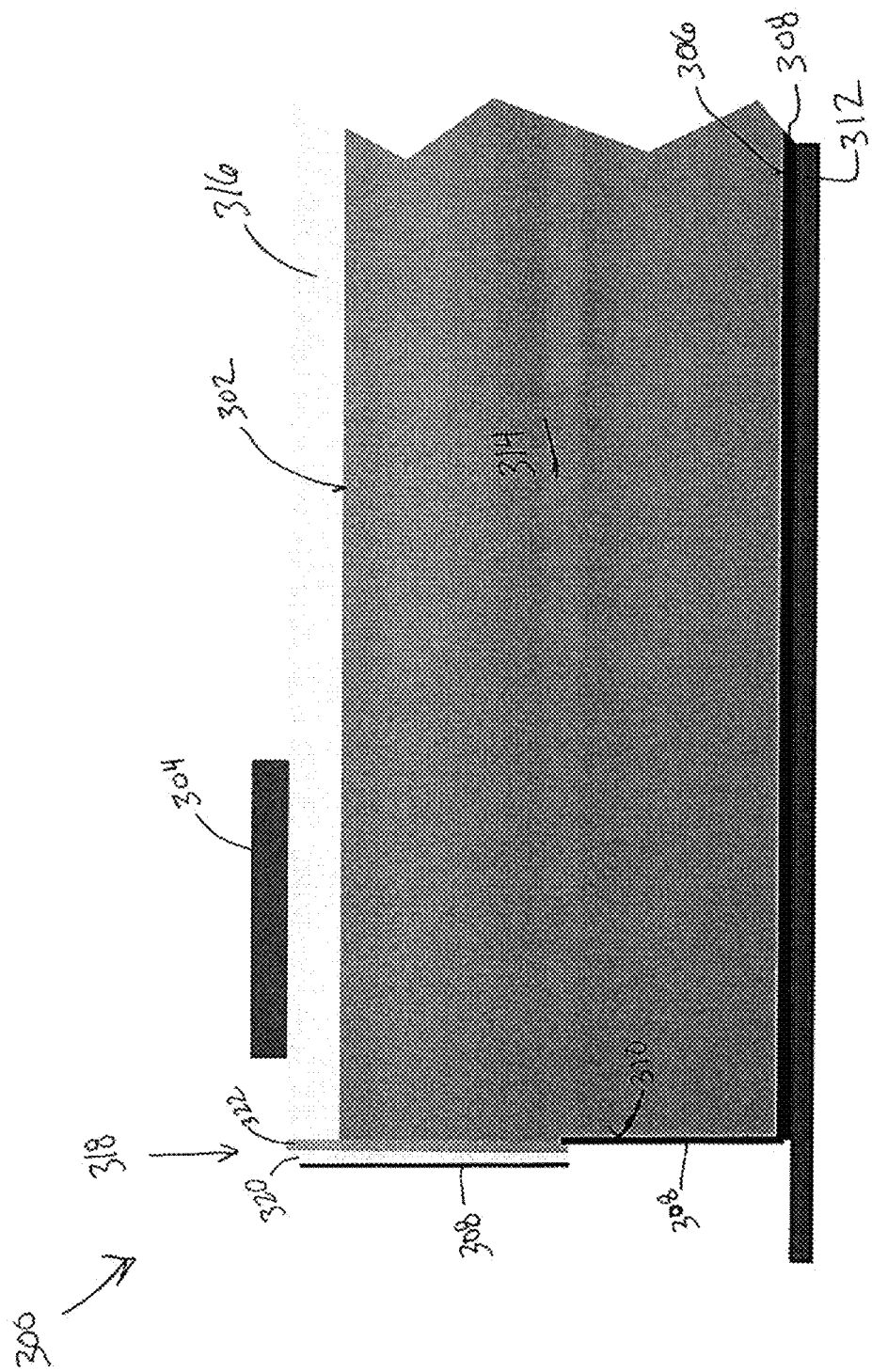
FIG. 3 illustrates a cross-sectional view of a non-molded semiconductor die having opposing main sides with different reflectivity.

FIG. 3 illustrates another embodiment of a semiconductor die 300 having a first side 302 with one or more terminals 304 and a second side 306 opposite the first side 302 that is treated with an electrically insulating coating 308 having a lower electrical conductivity than the semiconductor body 314 of the die 300. The electrically insulating coating 308 applied to the second side 306 of the die 300 can also extend over the sidewalls 310. Such a configuration increases the isolation along the sidewalls 310 of the die 300, limiting leakage current. In one embodiment, the electrically insulating coating 308 comprises a material such as carbon or polyimide which can be deposited by plasma CVD (chemical vapor deposition) at relatively low temperatures (e.g. less than 200° C.) to protect the dicing foil/film 312 on which the die 300 is disposed. In this case the coating 308 has a lower conductivity than the semiconductor body 314 as described above to provide electrical isolation, and also has a lower reflectivity than the first side 302 of the die 300 as previously described herein. A passivation layer 316 such as SiOx for a silicon body 314 can be disposed on the first side 302 of the die 300, and a sidewall passivation 318 can be provided that extends from the first side 302 along the sidewalls 310 and terminates prior to the second side 306. Any standard sidewall passivation can be used such as SiN 320 and/or SiOx 322 for a silicon body 314. The electrically insulating coating 308 applied to the second side 306 of the die 300 can also extend over the sidewall passivation 318. The electrically insulating coating 308 can be thicker on the second side 306 of the die 300 than on the sidewalls 310 of the die 300 and the sidewall passivation 318 e.g. in the case of plasma deposition.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A method of fixing semiconductor dies to an adhesive film, each semiconductor die having a first side with one or more terminals, a second side opposite the first side and sidewalls extending between the first and the second sides, the method comprising:

treating the second side of the semiconductor dies so that the treated second side of each semiconductor die has a lower reflectivity than the first side;

placing the semiconductor dies into a feeder after being treated at the second side, with one of the first or second side of each semiconductor die facing the feeder and the other side facing away from the feeder;

measuring the reflectivity of the side of the semiconductor dies facing away from the feeder;

determining, based on the measured reflectivity, whether any of the semiconductor dies placed in the feeder should be flipped so that the opposite side faces the feeder and the first side of each semiconductor die faces the same direction; and placing the semiconductor dies on a carrier tape after the first side of each semiconductor die faces the same direction in the feeder.

2. The method of claim 1, wherein treating the second side of the semiconductor dies comprises:

applying a coating to the second side of each semiconductor die, the coating having a lower reflectivity than the first side of the semiconductor die.

3. The method of claim 2, wherein the coating covers the second side and at least a region of the sidewalls nearest the second side of each semiconductor die.

4. The method of claim 2, wherein the coating is thicker on the second side of the semiconductor dies than on the sidewalls.

5. The method of claim 2, wherein the coating is selected from the group consisting of amorphous carbon, $Al_2O_3$, $HfO_2$, $ZrO_2$, silicon oxide, silicon nitride, and polyimide.

6. The method of claim 2, wherein the coating is electrically insulating.

7. The method of claim 1, wherein the semiconductor dies comprise silicon and treating the second side of the semiconductor dies comprises:

modifying the second side of each semiconductor die to include a needle-shaped surface structure comprising single-crystal silicon needles, the needle-shaped surface structure having a lower reflectivity than the first side of the semiconductor die.

8. The method of claim 1, wherein the semiconductor dies comprise silicon and treating the second side of the semiconductor dies comprises:

roughening the second side of each semiconductor die to reduce the reflectivity of the second side.

9. A semiconductor die taping apparatus, comprising:

a feeder for receiving a plurality of semiconductor dies, each semiconductor die having a first side with one or more terminals and a second side opposite the first side, the second side of each semiconductor die having a lower reflectivity than the first side;

a sensor operable to measure the reflectivity of the side of the semiconductor dies facing the sensor;

a control module operable to determine, based on the measured reflectivity, whether any of the semiconductor dies placed in the feeder should be flipped so that the opposite side faces the feeder and the first side of each semiconductor die faces the same direction;

an adjustment mechanism operable to actuate the semiconductor dies placed in the feeder responsive to input received from the control module; and a taping mechanism operable to place the semiconductor dies on a carrier tape after the first side of each semiconductor die faces the same direction in the feeder.

* * * * *